United States Patent
Senda et al.

(10) Patent No.: US 6,956,245 B2
(45) Date of Patent: Oct. 18, 2005

(54) GROUP III NITRIDE COMPOUND SEMICONDUCTOR LIGHT-EMITTING ELEMENT

(75) Inventors: Masanobu Senda, Aichi (JP); Toshiya Uemura, Aichi (JP); Hideki Omoya, Aichi (JP); Masaki Hashimura, Aichi (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 10/448,025

(22) Filed: May 30, 2003

(65) Prior Publication Data

US 2003/0222259 A1 Dec. 4, 2003

(30) Foreign Application Priority Data

May 31, 2002 (JP) .................................... P2002-159613
Mar. 25, 2003 (JP) .................................... P2003-081901

(51) Int. Cl.$^7$ ........................... H01L 27/15; H01L 33/00
(52) U.S. Cl. ............................. 257/94; 257/79; 257/99; 257/103; 257/615; 257/81; 257/98; 257/100
(58) Field of Search ........................... 257/79, 99, 103, 257/615, 81, 98, 100

(56) References Cited

U.S. PATENT DOCUMENTS

| 6,597,019 B2 * | 7/2003 | Inoue et al. .................. 257/99 |
| 6,680,490 B2 * | 1/2004 | Yasukawa et al. ............. 257/98 |
| 6,774,405 B2 * | 8/2004 | Yasukawa et al. ............. 257/99 |

FOREIGN PATENT DOCUMENTS

| EP | 1 302 989 A | 4/2003 |
| JP | 61-110476 | 5/1986 |
| JP | 06-120560 | 4/1994 |
| JP | 07-022648 | 1/1995 |
| JP | 08-102549 | 4/1996 |
| JP | 09-036427 | 2/1997 |
| JP | 11-126925 | 5/1999 |
| JP | 11-220168 | 8/1999 |
| JP | 11-220171 | 8/1999 |
| JP | 2000-036619 | 2/2000 |
| JP | 2000-183400 | 6/2000 |
| JP | 2000-188421 | 7/2000 |
| JP | 2000-286445 | 10/2000 |
| JP | 2001-332762 | 11/2001 |
| JP | 2002-353497 | 12/2002 |
| WO | WO 01/41225 A2 | 6/2001 |
| WO | WO 01/47039 A1 | 6/2001 |
| WO | WO 01/61765 A1 | 8/2001 |
| WO | WO 01/91196 A1 | 11/2001 |
| WO | WO 02/073705 A2 | 9/2002 |

* cited by examiner

Primary Examiner—Allan R. Wilson
Assistant Examiner—Joseph Nguyen
(74) Attorney, Agent, or Firm—McGinn & Gibb, PLLC

(57) ABSTRACT

A Group III nitride compound semiconductor light-emitting element has a reflecting surface on a side opposite to a main light-emitting surface of the element viewed from a light-emitting layer. The reflecting surface is inclined to surfaces of growth of semiconductor layers. Light emitted from the light-emitting layer is reflected by the reflecting surface, so that the reflected light emerges from side surfaces of the light-emitting element to the outside without passing through the semiconductor layers (particularly, the light-emitting layer).

22 Claims, 9 Drawing Sheets

↑ BLASTING

GROUP III NITRIDE COMPOUND SEMICONDUCTOR LIGHT-EMITTING ELEMENT

The present application is based on Japanese Patent Applications No. 2002-159613 and 2003-081901, which are incorporated herein by reference.

BACKGROUND OF THE INVENTION

1. Field of the Invention

The present invention relates to a Group III nitride compound semiconductor light-emitting element.

2. Description of the Related Art

A Group III nitride compound semiconductor light-emitting element is fixed to a support such as a lead frame. Light emitted from a light-emitting layer of the light-emitting element contains a light component advancing toward a main light-emitting surface of the light-emitting element, and a light component advancing toward a side (the support side) opposite to the main light-emitting surface. Incidentally, a general type light-emitting element is formed so that an electrode surface is used as a main light-emitting surface whereas a flip chip type light-emitting element is formed so that a substrate surface is used as a main light-emitting surface.

A reflecting layer was heretofore provided so that light advancing toward the support side could be reflected toward the main light-emitting surface side in order to use the light effectively as referred in the following documents. Unexamined Japanese Patent Publication No. 2000-286445 Unexamined Japanese Patent Publication No. Hei-8-102549 Unexamined Japanese Patent Publication No. Hei-9-36427

In such a light-emitting element, the reflecting surface is flat. Accordingly, light reflected by the reflecting surface (hereinafter referred to as "reflected light" occasionally) passes through semiconductor layers and emerges from the main light-emitting surface to the outside.

The present inventors have made an eager examination to attain improvement in light-emitting efficiency of the light-emitting element. As a result, it has been found that light reflected by the reflecting surface may be absorbed particularly to the light-emitting layer when the light passes through the semiconductor layers, and that this absorption is a cause of lowering in light-emitting efficiency.

SUMMARY OF THE INVENTION

The invention is developed on the basis of the inventors' knowledge and an object of the invention is to release reflected light from side surfaces of a light-emitting element to thereby prevent the reflected light from being attenuated by semiconductor layers. That is, the invention provides a Group III nitride compound semiconductor light-emitting element having a reflecting surface on a side opposite to a main light-emitting surface of the element viewed from a light-emitting layer, wherein light emitted from the light-emitting layer is reflected by the reflecting surface and at least a part of the reflected light emerges from side surfaces of the light-emitting element to the outside.

According to the light-emitting element configured as described above, light which is a part of light emitted from the light-emitting layer and which is reflected by the reflecting surface does not go toward the main light-emitting surface but is released from side surfaces of the light-emitting element to the outside. Accordingly, the reflected light is prevented from being absorbed to the semiconductor layers (particularly, the light-emitting layer). As a result, the amount of light emitted from the light-emitting element to the outside increases.

DETAILED DESCRIPTION OF THE PREFERRED EMBODIMENTS

Figure 1:
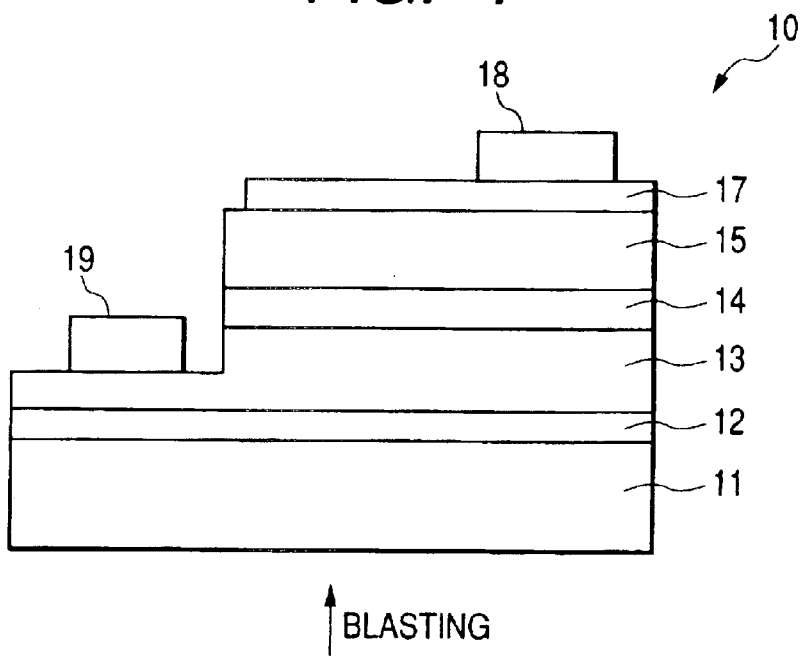
FIG. 1 is a sectional view typically showing a layer structure of a light-emitting element according to an embodiment of the invention.

Respective constituent members of the invention will be described below in detail.

(Substrate)

Any substrate can be used if Group III nitride compound semiconductor layers can be grown on the substrate. Examples of the substrate material include sapphire, spinel, silicon, silicon carbide, zinc oxide, gallium phosphide, gallium arsenide, magnesiumoxide, and manganese oxide. Particularly, a sapphire substrate is preferably used. When the sapphire substrate is used, a face a or c of the sapphire substrate is preferably used. This is for the purpose of growing Group III nitride compound semiconductor layers with good crystallinity.

(Group III Nitride Compound Semiconductor)

Group III nitride compound semiconductor layers are laminated on the substrate. Each Group III nitride compound semiconductor is represented by the general formula: $Al_X Ga_Y In_{1-X-Y} N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_x Ga_{1-x} N$, $Al_x In_{1-x} N$ and $Ga_x In_{1-x} N$ ($0<x<1$ in the above). The group III elements may be at least partially replaced by boron (B), thalliun (Tl), or the like, The nitrogen (N) maybe at least partially replaced by phosphorus (P), arsenic (As), antimony (Sb), bismuth (Bi), or the like Each Group III nitride compound semiconductor layer may contain an optional dopant. Si, Ge, Se, Te, C, or the like, can be used as n-type impurities. Mg, Zn, Be, Ca, Sr, Ba, or the like, can be used a sp-type impurities. A method for forming the Group III nitride compound semiconductor layers is not particularly limited. The Group III nitride compound semiconductor layers can be formed by a known method such as a metal organic chemical vapor deposition method (MOCVD method), a molecular beam epitaxy method (MBE method) a halide vapor phase epitaxy method (HVPE method), a sputtering method, an ion-plating method, or an electron showering method.

A buffer layer may be provided between the substrate and the crystalline layer of Group III nitride compound semiconductors. The buffer layer is provided for improving the crystallinity of Group III nitride compound semiconductors grown thereon. The buffer layer can be made of a Group III nitride compound semiconductor such as AlN, InN, GaN, AlGaN, InGaN, or AlInGaN.

(Reflecting Surface)

The reflecting surface is provided so that reflected light does not pass through the semiconductor layers (particularly, the light-emitting layer). The reflected light, which is reflected by the reflecting surface in the invention, is released from side surfaces of the element to the outside.

In the related art, because a reflecting layer parallel to a semiconductor growth surface and shaped like a flat plate was used, substantially all of reflected light was reflected toward the main light-emitting surface, so that the reflected light passed through the semiconductor layers. It the reflecting surface in the invention can prevent even a part of the reflected light from passing through the semiconductor layers in consideration of the related art, absorption of light to the semiconductor layers can be avoided. As a result, light-emitting efficiency of the light-emitting element can be improved. In the inventions therefore, this effect can be obtained if a surface having an angle different from that of the semiconductor growth surface, that is, a surface inclined to the semiconductor growth surface is formed as at least one portion of the reflecting surface. In other words, at least one portion of the reflecting surface is inclined with respect to the traveling direction of the light emitted from the light-emitting layer.

The reflecting surface for reflecting a light component, which is a part of light emitted from the light-emitting layer and which advances in a direction opposite to the main light-emitting surface, needs to be provided on a side opposite to the main light-emitting surface viewed from the light-emitting layer. Accordingly, the position where the reflecting surface is provided is not limited to a surface of the light-emitting element such as a rear surface of the substrate. For example, the reflecting surface may be formed in the inside of the light-emitting element.

The semiconductor growth surface means a semiconductor layer surface in the case where each semiconductor layer is grown at an equal growth rate on the whole region of the effective substrate surface. When the substrate surface is flat, the growth surface of each semiconductor is parallel to the substrate surface. The fact that the reflecting surface has an angle different from that of the semiconductor growth surface means the fact that the reflecting surface is not parallel to the surface of each semiconductor layer. In other words, the reflecting surface does not cross the direction of growth of each semiconductor perpendicularly but is inclined to the direction of growth of each semiconductor.

For example, the reflecting surface as described above can be formed by provision of irregularities, of which height or depth is larger than the wavelength of light emitted from the light-emitting layer. For example, such irregularities can be formed when blasting is applied to the rear surface of the substrate. Blasting is preferred because the whole surface of the substrate can be processed easily.

A taper surfacer may be also used as the reflecting surface. In this case, the taper surface maybe formed as the whole region of the reflecting surface or nay be formed as a part of the reflecting surface. In order to release the reflected light from side surfaces of the element surely, the taper surface preferably has an angle of about 45 degrees to the semiconductor growth surface.

In the case of a flip chip type light-emitting element, after the uppermost semiconductor layer is etched to form an irregular or taper surface, a metal electrode film is laminated as a reflecting layer on the irregular or taper surface.

Any reflecting surface may be used if the reflecting surface can reflect light emitted from the light-emitting layer When, for example, the substrate is in contact with a material largely different from the substrate material, the interference between the two materials (i.e., the rear surface of the substrate) can serve as a reflecting surface.

In order to utilize light emitted from the light-emitting layer more efficiently, it is preferable that the reflecting surface totally reflects the light emitted from the light-emitting layer. It is therefore preferable that a layer (reflecting layer) having a mirror surface is formed, for example, on the rear surface of the substrate.

Examples of the material of the reflecting layer which can be used include: a metal such as gold, aluminum or silver; an alloy of these metals; and nitride such as titanium nitride, zirconium nitride, hafnium nitride or tantalum nitride. Alternatively, a multilayer film composed of two or more kinds of dielectrics with a thickness adjusted to selectively reflect light emitted from the light-emitting layer may be used as the reflecting layer.

Embodiments of the invention will be described below.

FIG. 1 is a sectional view typically showing a light-emitting element 10 according to an embodiment of the invention. Specifications of respective layers in the light-emitting element 10 are as follows.

| Layer | Composition |
| --- | --- |
| p-type layer 15 | p-GaN:Mg |
| Layer 14 containing a light-emitting layer | including InGaN layer |
| n-type layer 13 | n-GaN:Si |
| Buffer layer 12 | AlN |
| Substrate 11 | sapphire |

The n-type layer 13 of GaN doped with Si as n-type impurities is formed on the substrate 11 through the buffer layer 12. Although here is shown the case where sapphire is used as the substrate 11, the invention is not limited thereto. For example, sapphire, spinel, silicon, silicon carbide, zinc oxide, gallium phosphide, gallium arsenide, magnesium oxide, manganese oxide, zirconium boride, Group III nitride compound semiconductor single crystal, or the like, may be used as the substrate material. Although here is also shown the case where the buffer layer is made of AlN by an MOCVD method, the invention is not limited thereto. For example, GaN, InN, AlGaN, InGaN, or AlInGaN may be used as the material of the buffer layer. A molecular beam epitaxy method (MBE method), a halide vapor phase epitaxy method (HVPE method), a sputtering method, an ion-plating method, an electron showering method, or the like, may be used as the method for forming the buffer layer. When Group III nitride compound semiconductor is used as the substrate, the buffer layer can be dispensed with.

Further, after the semiconductor element is formed, the substrate and the buffer layer may be removed as occasion demands.

Although here is shown the case where the n-type layer 13 is made of GaN, the n-type layer 13 may be made of AlGaN, InGaN or AlInGaN.

Although here is shown the case where the n-type layer 13 is doped with Si as n-type impurities, Ge, Se, Te, C, or the like, may be used as other n-type impurities.

The layer 14 containing a light-emitting layer may include a quantum well structure (multiple quantum well structure or single quantum well structure). A single or double hetero type structure or a homo-junction type structure may be used as the structure of the light-emitting element.

The layer 14 containing a light-emitting layer may include a Group III nitride compound semiconductor layer provided on the p-type layer 15 side, doped with Mg or the like and having a wide band gap. This is a technique for effectively preventing electrons injected into the layer 14 containing a light-emitting layer from diffusing into the p-type layer 15.

The p-type layer 15 of GaN doped with Mg as p-type impurities is formed on the layer 14 containing a light-emitting layer. The p-type layer may be also made of AlGaN, InGaN or InAlGaN. Zn, Be, Ca, Sr or Ba may be used as other p-type impurities. After the p-type impurities are introduced into the p-type layer 15, the resistance of the p-type layer 15 may be reduced by a known method such as electron beam irradiation, heating by a furnace, or plasma irradiation.

In the light-emitting diode configured as described above, each Group III nitride compound semiconductor layer maybe formed by execution of an MOCVD method in a general condition or may be formed by a method such as a molecular beam epitaxy method (MBE method), a halide vapor phase epitaxy method (HVPE method), a sputtering method, an ion-plating method, or an electron showering method.

An n-electrode 19 has two layers of Al and V. After the p-type layer 15 is formed, the p-type layer 15, the layer 14 containing a light-emitting layer and the n-type layer 13 are partially removed by etching. The n-electrode 19 is formed on the removed portion of the n-type layer 13 by vapor deposition.

A transparent electrode 17 is made of a thin film containing gold. The transparent electrode 17 is laminated on the p-type layer 15. A p-electrode 18 is also made of a material containing gold. The p-electrode 1B is formed on the transparent electrode 17 by vapor deposition.

Blasting is applied to the rear surface of the substrate 11 of the light-emitting element 10.

The condition of blasting is as follows.

EXAMPLE 1

SiC Particles No. 600, 50 mm Distance, Air Pressure 0.2 MPa

EXAMPLE 2

SiC Particles No. 400, 50 mm Distance, Air Pressure 0.2 MPa

In each of Examples 1 and 2, irregularities are provided on the rear surface of the substrate in this manner. The total light flux of the light-emitting element obtained in each of Examples 1 and 2 is measured.

Figure 2:
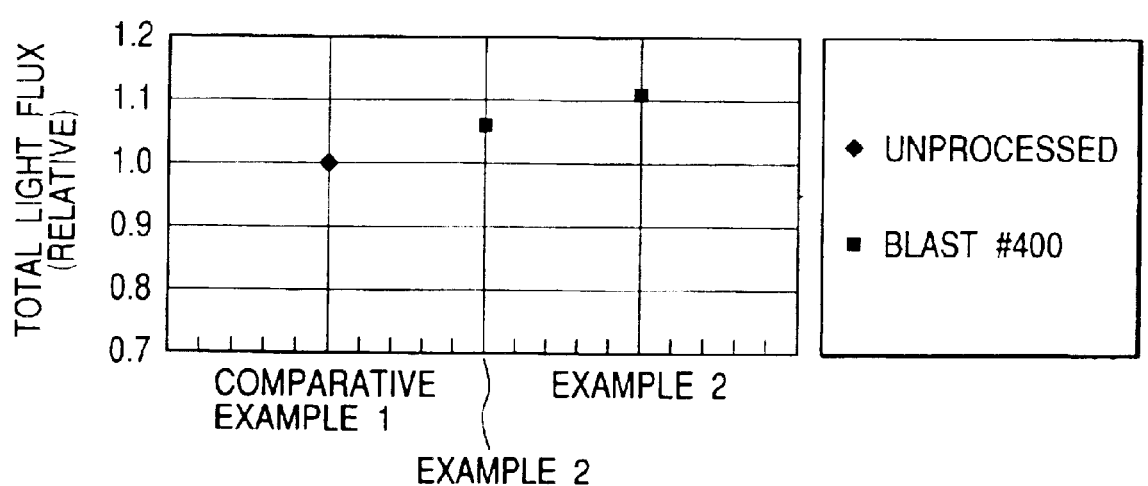
FIG. 2 is a graph showing an effect in the case where blasting is applied to a rear surface of a substrate.

FIG. 2 shows a result of the measurement. It is obvious from the result shown in FIG. 2 that the total light flux of the light-emitting element obtained in each of Examples 1 and 2 in which blasting is applied to the rear surface of the substrate to provide the rear surface of the substrate as a irregular reflecting surface is improved by about 10% compared with that of the light-emitting element obtained in Comparative Example 1 in which the rear surface of the substrate is flat.

Figure 3:
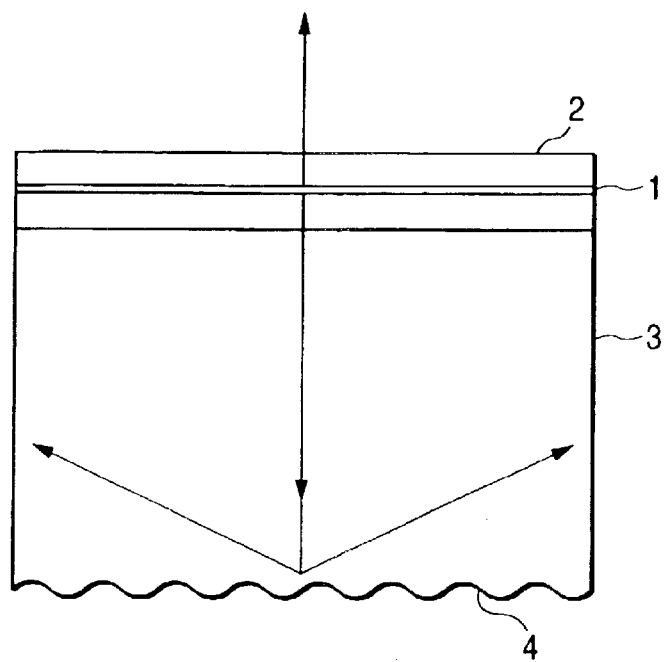
FIG. 3 is a typical view showing optical paths of reflected light in the light-emitting element in the case where blasting is applied to a rear surface of a substrate.

As shown in FIG. 3 which typically shows optical paths of light emitted from a light-emitting layer 1, light emitted from the light-emitting layer 1 in a direction opposite to a main light-emitting surface 2 (on the electrode side in the example of FIG. 1) is reflected toward side surfaces of the element by a reflecting surface 4. The reflected light does not pass through the semiconductor layers but emerges mainly from side surfaces of a substrate 3 to the outside. This is because the thickness of the substrate 3 is overwhelmingly larger than the total thickness of the semiconductor layers in the light-emitting element. Accordingly, the reflected light is prevented from being absorbed/attenuated by the semiconductor layers (particularly, the light-emitting layer). As a result, substantially all of the reflected light can be taken out to the outside.

Figure 4:
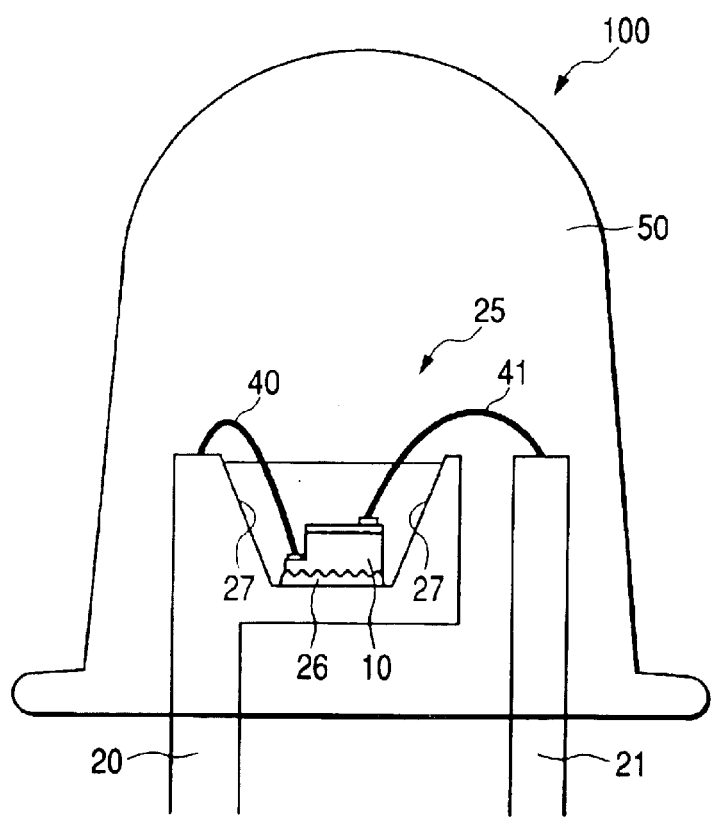
FIG. 4 is a view showing configuration of a round type LED mounted with the light-emitting element according to the embodiment.

As shown in FIG. 4, the light-emitting element 10 is mounted in a cup-like portion 25 provided in a lead frame 20, by use of silver paste 26. The cup-like portion 25, which serves as a seat for receiving the light-emitting element, has a peripheral wall surface 27 which is formed as a mirror surface for improving light-reflecting efficiency so that the peripheral wall surface 27 serves as a side reflecting surface.

The n-electrode 19 and the p-electrode 18 in the light-emitting element 10 are wire-bonded to lead frames 20 and 21 by wires 40 and 41 respectively.

The light-emitting element 10, respective parts of the lead frames 20 and 21 and the wires 40 and 41 are sealed with a sealing resin 50 made of an epoxy resin. The material of the sealing resin 50 is not particularly limited if the material is transparent. Besides the epoxy resin, a silicone resin, an urea resin or a glass material may be used preferably. A fluorescent substance and/or a light-diffusing material may be dispersed into the sealing resin 50 evenly or unevenly.

The sealing resin 50 is provided for the purpose of protecting the structure of the element. When the shape of the sealing resin 50 is changed according to the purpose, a lens effect can be provided to the sealing resin 50. For example, the sealing resin 50 may be molded into a concave lens shape, or a convex lens shape other than the round shape shown in FIG. 4. The sealing resin 50 may be also shaped like a circle, an ellipse or a rectangle viewed from the light-extracting direction (upward direction in FIG. 4).

In the LED 100 configured as described above, light reflected by the reflecting layer on the rear surface of the light-emitting element 10 is released from side surfaces of the element and reflected upward in FIG. 4 by the circumferential wall surface 27 of the cup-like portion 25. Accordingly, the reflected light can be used effectively.

Figure 5:
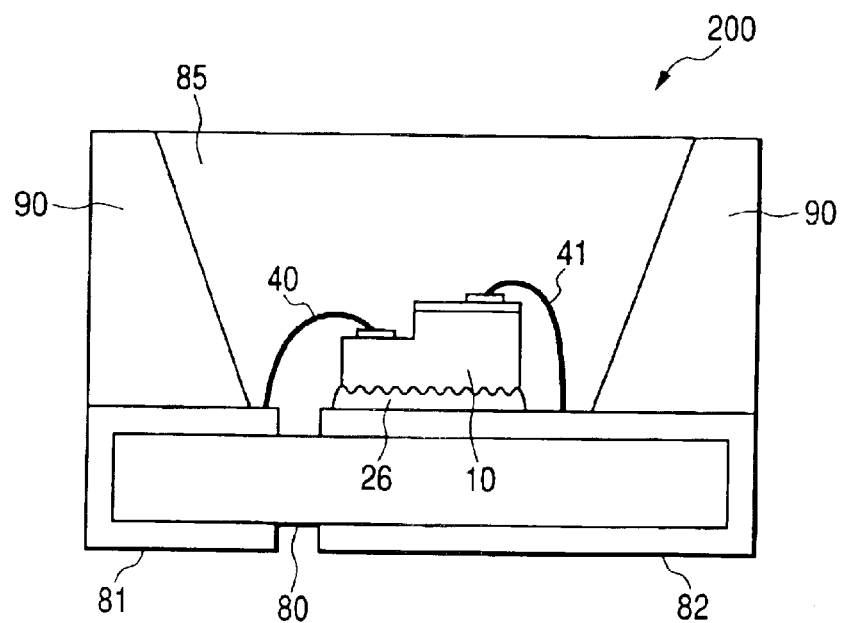
FIG. 5 is a view showing configuration of an SMD type LED mounted with the light-emitting element according to the embodiment.

FIG. 5 is a schematic sectional view of an SMD type LED 200. In FIG. 5, parts the same as those of the LED 100 shown in FIG. 4 are denoted by the same reference numerals as those shown in FIG. 4 for the sake of omission of duplicated description.

The light-emitting element 10 is fixed to a substrate 80 by silver paste 26. The substrate 80 is provided with electrodes 81 and 82. The wires 40 and 41 connect electrodes of the light-emitting element 10 to the electrodes 81 and 82 respectively. The reference numeral 85 designates a sealing resin. The reference numeral 90 designates a reflector formed around the light-emitting element. The reflector 90 has a surface mirror-finished as a side reflecting surface.

Also in the SMD type LED 200, light reflected by the reflecting layer on the rear surface of the light-emitting element 10 is released from side surfaces of the element and reflected upward in FIG. 5 by the surface of the reflector 90. Accordingly, the reflected light is utilized effectively.

Figure 6:
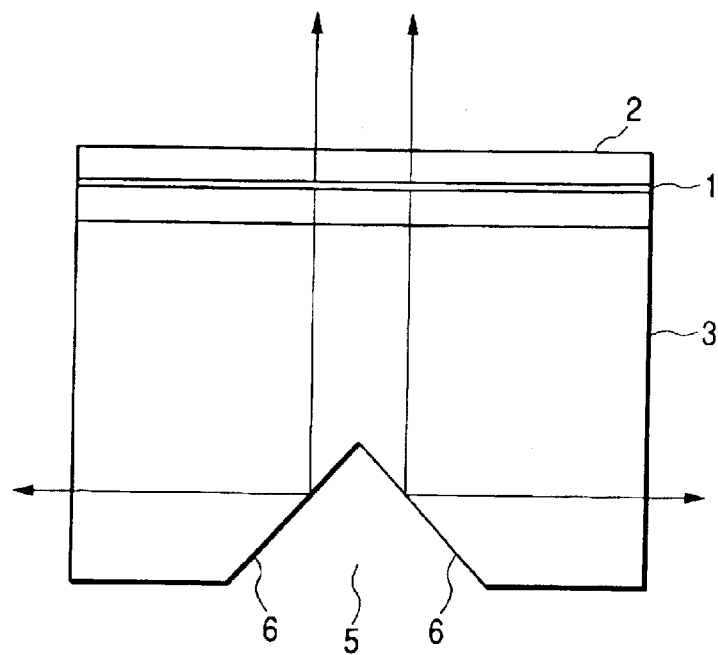
FIG. 6 is a typical view showing optical paths of reflected light in the light-emitting element in the case where a groove is formed in a rear surface of a substrate.

FIG. 6 is a typical view of a light-emitting element having another type reflecting surface. In FIG. 6, parts the same as those shown in FIG. 3 are denoted by the same reference numerals as those shown in FIG. 3 for the sake of omission of duplicated description. The layer structure of the light-emitting element in FIG. 6 is the same as that described above with reference to FIG. 1. The form for assembling the light-emitting element in FIG. 6 into a LED is the same as the form shown in FIG. 4 or 5.

In the light-emitting element, a groove 5 shaped like a V figure in section is formed in the substrate 3. The groove 5 is formed by a dicer. The groove 5 has a wall surface 6 which serves as a reflecting surface which is a taper surface.

The condition of the groove is as follows.

EXAMPLE 3

The depth of the groove is 20 $\mu$m. The angle between wall surfaces 6 and 6 is 90°.

EXAMPLE 4

A second groove is further provided so as to cross the groove of Example 3 perpendicularly at substantially the center of the substrate.

At least one groove is provided in the rear surface of the substrate in this manner. The total light flux of the light-emitting element obtained in each of Examples 3 and 4 is measured.

Figure 7:
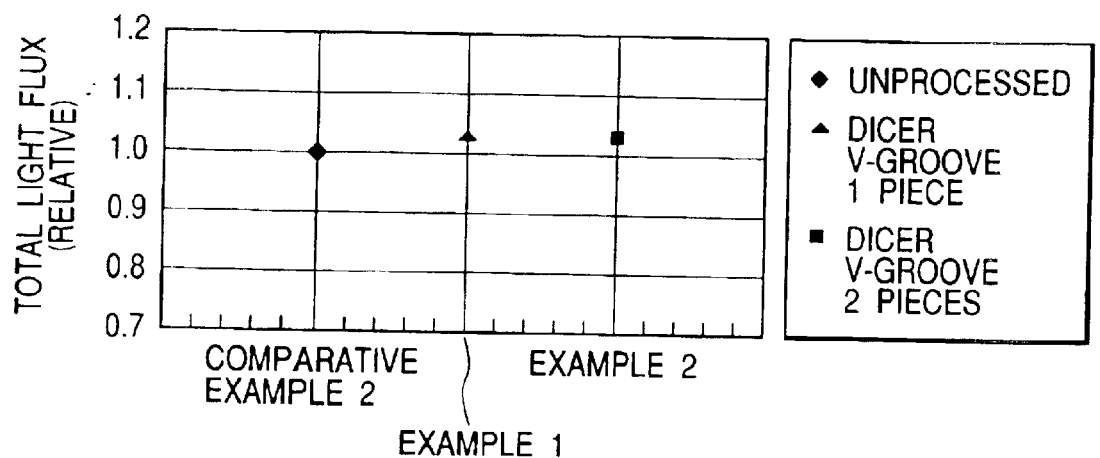
FIG. 7 is a graph showing an effect in the case where at least one groove is formed in a rear surface of a substrate.

FIG. 7 shows a result of the measurement.

It is obvious from the result shown in FIG. 7 that the total light flux of the light-emitting element obtained in each of Examples 3 and 4 in which the taper surface is provided as a reflecting surface in the substrate is improved by about 5% compared with that of the light-emitting element obtained in Comparative Example 2 in which the rear surface of the substrate is flat.

Incidentally, in comparison of directivity (angle of 2θ4/5 (degrees): solid angle wherein the output intensity shows 4/5 of the maximum output intensity in the normal direction) between Comparative Example 2 and Example 3, the directivity in Example 3 is 110 degrees whereas the directivity in Comparative Example 2 is 107 degrees. It is also obvious from this data that reflected light can be released from side surfaces of the element when the taper surface is provided.

Figure 8:
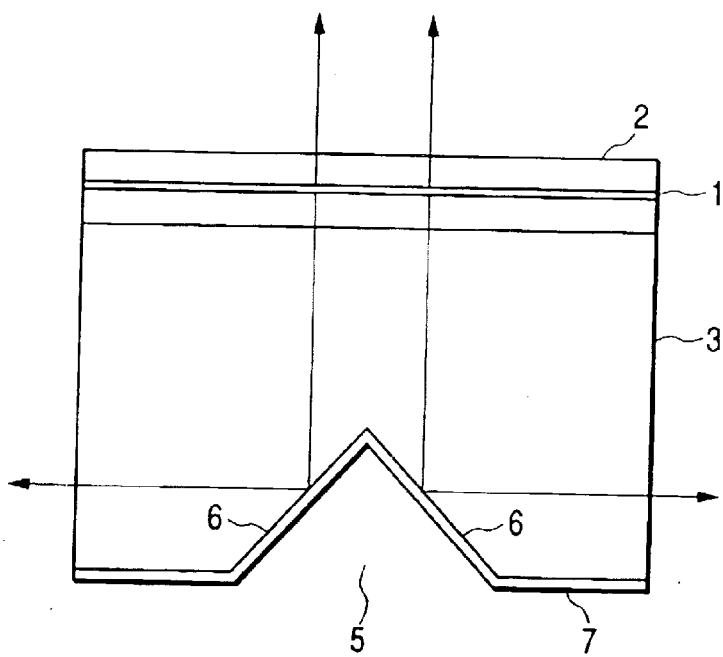
FIG. 8 is a typical view showing optical paths of reflected light in the light-emitting element in the configuration where a groove is formed in a rear surface of a substrate and a metal reflecting film is further vapor-deposited on the rear surface of the substrate.

FIG. 8 is a typical view of a light-emitting element having another type reflecting surface. In FIG. 8, parts the same as those shown in FIG. 6 are denoted by the same reference numerals as those shown in FIG. 6 for the sake of omission of duplicated description. The layer structure of the light-emitting element in FIG. 8 is the same as that described above with reference to FIG. 1. The form for assembling the light-emitting element in FIG. 8 into a LED is the same as the form shown in FIG. 4 or 5.

In the light-emitting element, aluminum vapor (film thickness: about 0.3 $\mu$m) is deposited on the whole region of the rear surface of the substrate 3 to form a reflecting layer 7.

Figure 9:
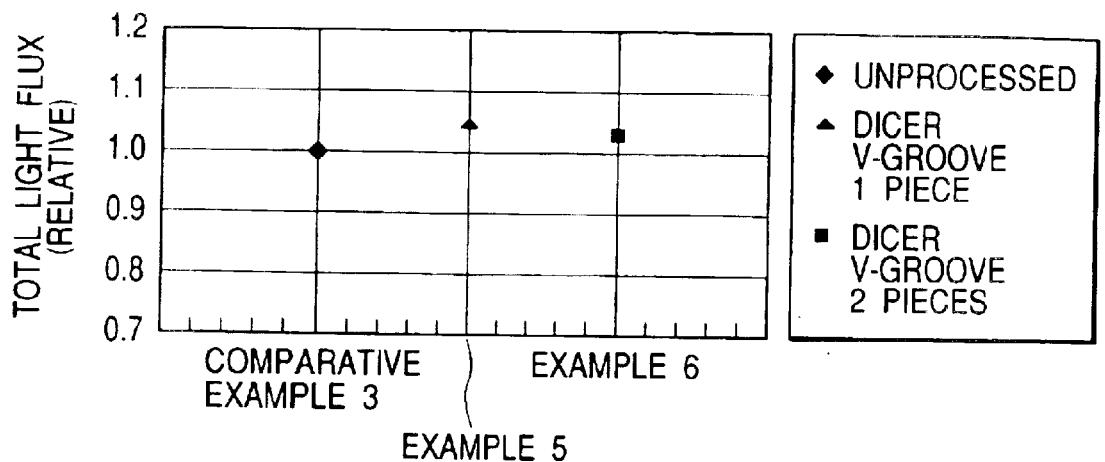
FIG. 9 is a graph showing an effect in the case where at least one groove is formed in a rear surface of a substrate and a metal reflecting film is further vapor-deposited on the rear surface of the substrate.

FIG. 9 shows a result of measurement of total light flux.

It is obvious from the result shown in FIG. 9 that the total light flux of the light-emitting element obtained in each of Examples 5 and 6 in which a taper surface is provided as a reflecting surface in the substrate is improved by about 5% compared with that of the light-emitting element obtained in Comparative Example 3 in which the rear surface of the substrate (having a reflecting layer) is flat Example 5 is made by providing the reflecting layer 7 on Example 3. Example 6 is made by providing the reflecting layer 7 on Example 4.

Incidentally, in comparison of directivity (angle of 2θ4/5 (degrees)) between Comparative Example 3 and Example 5, the directivity in Example 5 is 101 degrees whereas the directivity in Comparative Example 3 is 94 degrees. It is also obvious from this data that reflected light can be released from side surfaces of the element when the taper surface is provided.

Figure 10A:
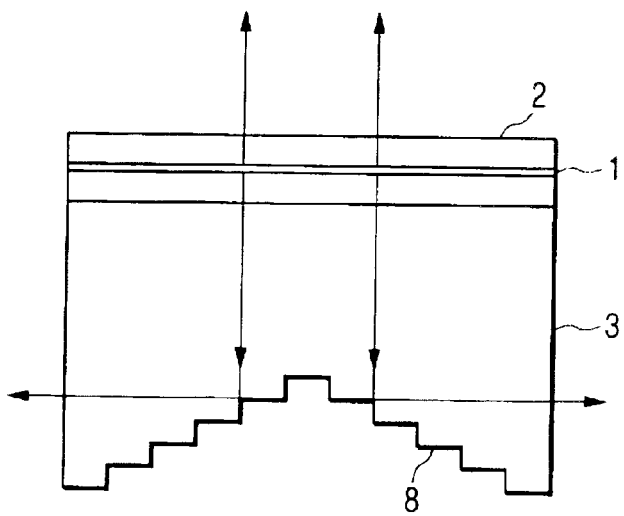
FIG. 10A is a typical view showing optical paths of reflected light in the light-emitting element in which a hemispherical concave portion (having irregularities on its surface) is formed in a rear surface of a substrate.

FIG. 10A is a typical view of a light-emitting element having another type reflecting surface. In FIG. 10A, parts the same as those shown in FIG. 3 are denoted by the same reference numerals as those shown in FIG. 3 for the sake of omission of duplicated description. The layer structure of the light-emitting element in FIG. 10A is the same as that described above with reference to FIG. 1. The form for assembling the light-emitting element in FIG. 10A into a LED is the same as the form shown in FIG. 4 or 5.

In the light-emitting element, a hemispherical concave portion is provided in the rear surface of the substrate. Irregularities are provided on a surface of the hemispherical concave portion to form a reflecting surface 8. According to the reflecting surface 8, light emitted from the light-emitting layer 1 can be reflected toward sides of the element more surely.

Figure 10B:
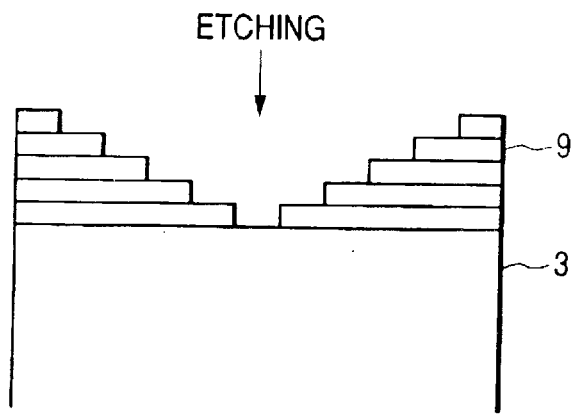
FIG. 10B is a view for explaining a method for forming the hemispherical concave portion.

For example, the reflecting surface 8 can be formed as follows. As shown in FIG. 10B, resist members 9 made of a material capable of being etched at an etching rate equal to that for etching the substrate 3 are laminated as a plurality of layers to form a concave portion symmetrical to the hemispherical concave portion which will be formed in the substrate 3. In the state shown in FIG. 10B, the rear surface of the substrate 3 is etched. When the resist members 9 are removed by the etching, the reflecting surface 8 shown in FIG. 10A is formed.

Figure 11:
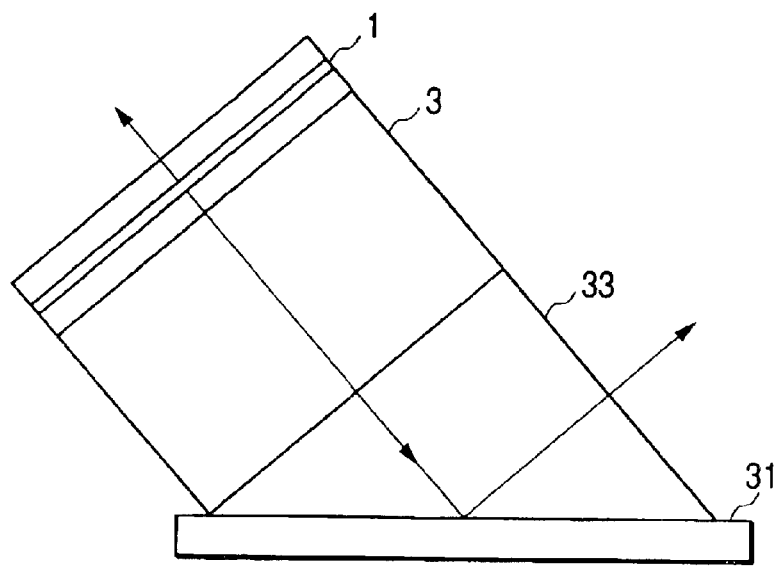
FIG. 11 is a typical view showing optical paths of reflected light in the light-emitting element in which the rear surface of the substrate is inclined to a reflecting plate.

FIG. 11 is a typical view of a light-emitting element having another type reflecting surface. In FIG. 11, parts the same as those shown in FIG. 3 are denoted by the same reference numerals as those shown in FIG. 3 for the sake of omission of duplicated description. The layer structure of the light-emitting element in FIG. 11 is the same as that described above with reference to FIG. 1. The form for assembling the light emitting element in FIG. 11 into a LED is the same as the form shown in FIG. 4 or 5.

In the light-emitting element, the substrate 3 is disposed so that the rear surface of the substrate 3 is inclined to a metal reflecting plate 31 having a mirror surface (reflecting surface) as its upper surface. The substrate 3 and the reflecting plate 31 are fixed to each other by a bonding member 33 made of a transparent material. In the light-emitting element configured as described above, a light component, which is a part of light emitted from the light-emitting layer 1 and which advances toward the substrate side, passes through the substrate 3 and the bonding member 33 and is reflected by the reflecting plate 31, so that the light component is emitted toward side surfaces of the element.

The material of the bonding member 33 is preferably selected to have a refractive index nearly equal to that of the material of the substrate 3. This is for the purpose of avoiding reflection in the interface between the substrate 3 and the bonding member 33.

Figure 12A:
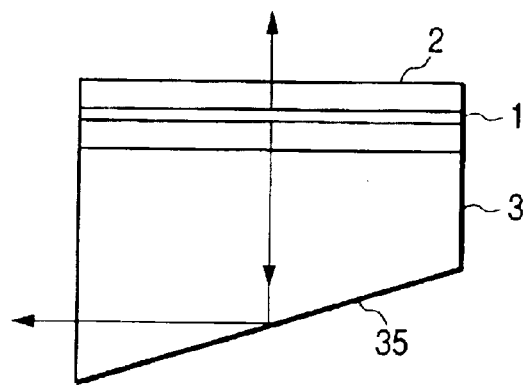
FIG. 12A is a typical view showing optical paths of reflected light in the light-emitting element in which the rear surface of the substrate is inclined.

FIG. 12A is a typical view of a light-emitting element having another type reflecting surface. In FIG. 12A, parts the same as those shown in FIG. 3 are denoted by the same reference numerals as those shown in FIG. 3 for the sake of omission of duplicated description. The layer structure of the light-emitting element in FIG. 12A is the same as that described above with reference to FIG. 1. The fort for assembling the light-emitting element in FIG. 12A into a LED is the same as the form shown in FIG. 4 or 5.

In the light-emitting element, the lower surface of the substrate 3 is inclined and provided as a reflecting surface 35. In the light-emitting element configured as described above, a light component, which is a part of light emitted from the light-emitting layer 1 and which advances toward the substrate side, is reflected by the inclined surface (reflecting surface 35) of the substrate 3, so that the light component is emitted toward side surfaces of the element.

Figure 12B:
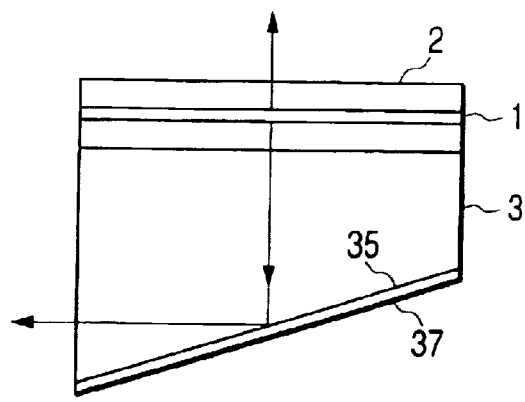
FIG. 12B shows an example in which a reflecting film is provided on the rear surface of the substrate.

As shown in FIG. 12B, a metal reflecting film 37 may be formed on the lower surface of the substrate 3 by vapor deposition.

When, for example, the lower surface of the substrate 3 is etched or polished, the lower surface of the substrate 3 can be provided as an inclined surface.

Figure 13:
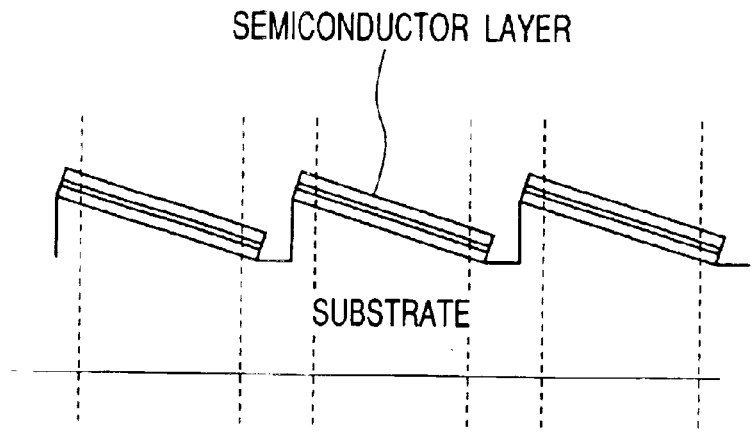
FIG. 13 is a view for explaining a method for forming the light-emitting element in which the rear surface of the is substrate is inclined.

Alternatively, as shown in FIG. 13, each semiconductor growth surface of the substrate may be inclined in advance so that semiconductor layers can be grown in a direction perpendicular to the semiconductor growth surface to thereby obtain the inclined surface. In FIG. 13, the broken lines show regions for separating a wafer into elements.

Figure 14:
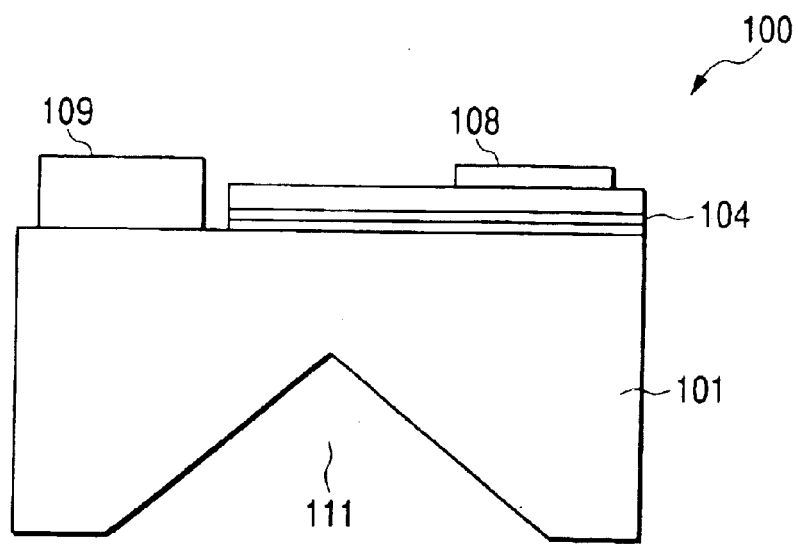
FIG. 14 is a sectional view showing configuration of a light-emitting element having another type reflecting surface.
Figure 15:
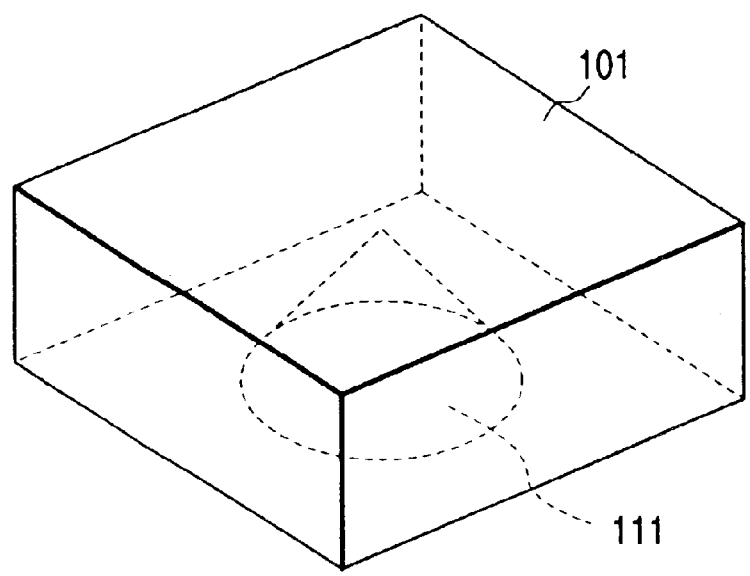
FIG. 15 is a perspective view showing the shape of the concave portion formed in the substrate in the light-emitting element depicted in FIG. 14.

FIGS. 14 and 15 show a light-emitting element 100 having another type reflecting surface, The light-emitting element 100 has a sapphire substrate 101, a light-emitting layer 104, a p-electrode 108, and an n-electrode 109.

As shown in FIG. 15, a conical concave portion 111 is formed at substantially the center of the rear surface of the substrate 101 in the light-emitting element 100.

The semiconductor layer structure of the light-emitting element 100 is substantially the same as that described above with reference to FIG. 1. The form for assembling the light-emitting element 100 is the same as the form shown in FIG. 4 or 5.

According to the light-emitting element 100 configured as described above, a light component, which is a part of light emitted from the light-emitting layer 104 and which advances toward the substrate 101 side, is reflected by the circumferential surface of the concave portion 111. Because the concave portion 111 is shaped like a cone here, the circumferential surface (i.e., the reflecting surface) of the concave portion 111 has line symmetry in all circumferential directions with respect to the center axis of the light-emitting element 100. Accordingly, the light is reflected from the center of the light-emitting element 100 in all circumferential directions, so that the light is emitted from side surfaces of the light-emitting element 100. As a result, light-emitting efficiency of the LED is improved.

Figure 16:
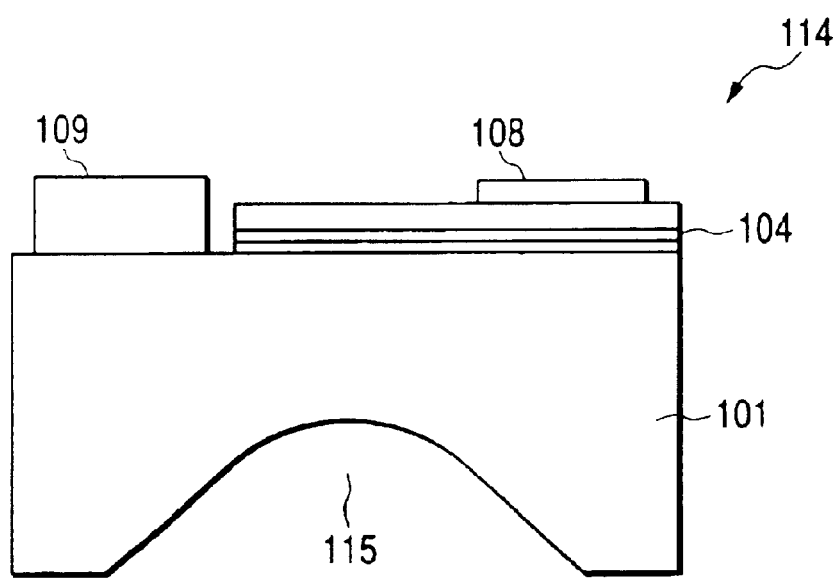
FIG. 16 is a sectional view showing configuration of a light-emitting element having a further type reflecting surface.
Figure 17A:
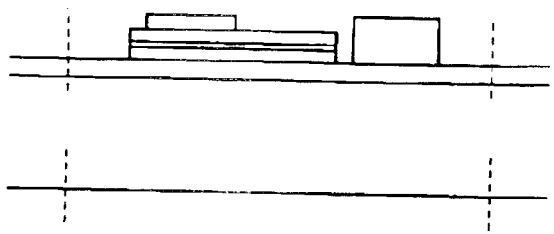
FIGS. 17A to 17D are views showing a process for producing the light-emitting element depicted in FIG. 14.
Figure 17B:
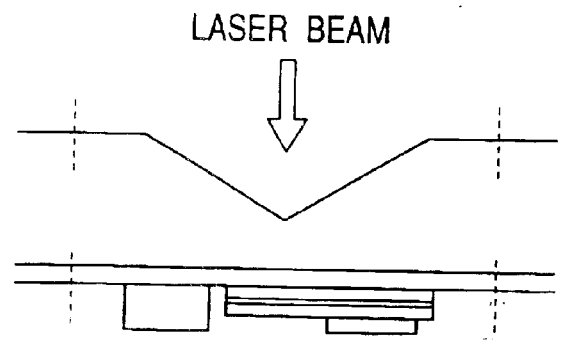
Figure 17C:
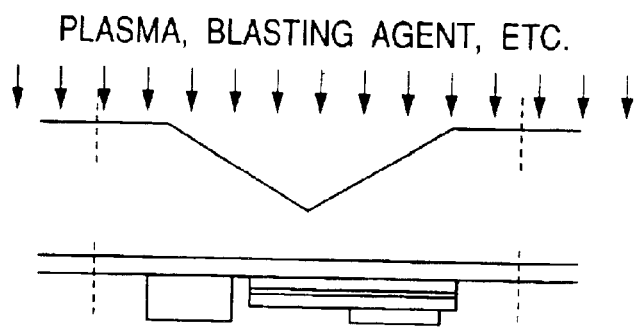
Figure 17D:
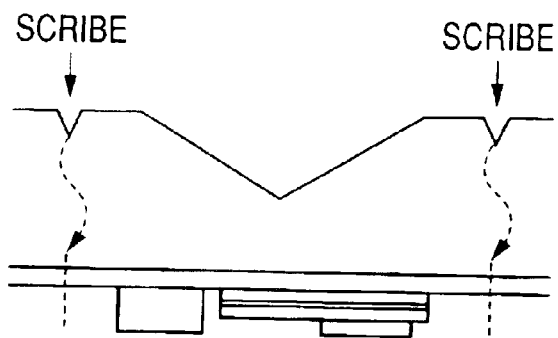

FIG. 16 shows an example of a light-emitting element 114 having a hemispherical concave portion 115. In FIG. 16, parts the same as those shown in FIG. 14 are denoted by the same reference numerals as those shown in FIG. 14 for the sake of omission of duplicated description. Also in the light-emitting element 114, light can be emitted from side surfaces of the light-emitting element 114 in the same manner as the light-emitting element 100 shown in FIG. 14.

In the light-emitting element shown in each of FIGS. 14 and 16, a reflecting layer can be laminated on a surface of the concave portion 111 or 115 in the same manner as shown in FIG. 8.

FIGS. 17A to 17D show a process for producing the light-emitting element 100 depicted in FIG. 14.

First, in step A (FIG. 17A), the rear surface of the sapphire substrate 101 is polished by a known method to prepare the sapphire substrate 101 about 200 μm thick. Then, in step B (FIG. 17B), the center of the element is decided on the basis of image recognition of the electrode pattern from the rear surface and the decided center (or its vicinity) is irradiated with a laser beam As a result, the rear surface of the element is etched to form a concave portion. In this embodiments the third harmonic (355 nm) of a YAG pulse laser is used. A galvanometer mirror is used for scanning the rear surface of the element with this laser beam to thereby obtain a required concave shape.

In step C (FIG. 17C), plasma or a blasting agent is applied on the whole region of the rear surface of the substrate 101 by a dry etching apparatus to thereby remove stains and molten layers caused by laser machining. Succeedingly, in step D (FIG. 17D), a diamond scriber is used for scribing mark-off lines between chips. The wafer is pressed by a roller so as to be cut into chips.

The invention is not limited to the description of mode for carrying out the invention and the description of embodiments at all. Various modifications that can be conceived easily by those skilled in the art are included in the invention without departing from the scope of claim.

What is claimed is:

1. A Group III nitride compound semiconductor light-emitting element comprising:
    a reflecting surface on a side opposite to a main light-emitting surface of said element viewed from a light-emitting layer thereof,
        wherein said reflecting surface includes, as at least one portion, a surface inclined to a surface of growth of each semiconductor layer of the element,
        wherein said reflecting surface reflects light emitted from said light-emitting layer such that at least a part of the reflected light emerges from a side surface of said light-emitting element to an outside, and
        wherein said reflecting surface includes an irregular surface.

2. A Group III nitride compound semiconductor light-emitting element according to claim 1, wherein said reflecting surface comprises a rear surface of a substrate.

3. A Group III nitride compound semiconductor light-emitting element according to claim 2, wherein a layer including a mirror surface is laminated on said rear surface of said substrate.

4. A light-emitting device comprising:
   a Group III nitride compound semiconductor light-emitting element according to claim 3; and
   a side reflecting surface that reflects light emitted from the side surface of said light-emitting element toward an optical axis of said light-emitting device.

5. A light-emitting device comprising:
   a Group III nitride compound semiconductor light-emitting element according to claim 2; and
   a side reflecting surface that reflects light emitted from the side surface of said light-emitting element toward an optical axis of said light-emitting device.

6. A Group III nitride compound semiconductor light-emitting element according to claim 1, wherein said irregular surface comprises a blasted irregular surface.

7. A light-emitting device comprising:
   a Group III nitride compound semiconductor light-emitting element according to claim 6; and
   a side reflecting surface that reflects light emitted from the side surface of said light-emitting element toward an optical axis of said light-emitting device.

8. A Group III nitride compound semiconductor light-emitting element according to claim 1, wherein said reflecting surface comprises a taper surface.

9. A Group III nitride compound semiconductor light-emitting element according to claim 8, wherein said taper surface comprises a diced taper surface.

10. A light-emitting device comprising:
    a Group III nitride compound semiconductor light-emitting element according to claim 9; and
    a side reflecting surface that reflects light emitted from the side surface of said light-emitting element toward an optical axis of said light-emitting device.

11. A light-emitting device comprising:
    a Group III nitride compound semiconductor light-emitting element according to claim 8; and
    a side reflecting surface that reflects light emitted from the side surface of said light-emitting element toward an optical axis of said light-emitting device.

12. A Group III nitride compound semiconductor light-emitting element according to claim 1, wherein said reflecting surface comprises at least one of a concave conical surface and a hemispherical surface formed on a rear surface of a substrate.

13. A Group III nitride compound semiconductor light-emitting element according to claim 12, wherein said reflecting surface comprises a laser machined reflecting surface.

14. A light-emitting device comprising:
    a Group III nitride compound semiconductor light-emitting element according to claim 13; and
    a side reflecting surface that reflects light emitted from the side surface of said light-emitting element toward an optical axis of said light-emitting device.

15. A light-emitting device comprising:
    a Group III nitride compound semiconductor light-emitting element according to claim 12; and
    a side reflecting surface that reflects light emitted from the side surface of said light-emitting element toward an optical axis of said light-emitting device.

16. A Group III nitride compound semiconductor light-emitting element according to claim 1, wherein said light-emitting surface is on a substrate side whereas said reflecting surface is formed on a front surface of said semiconductor layer.

17. A light-emitting device comprising:
    a Group III nitride compound semiconductor light-emitting element according to claim 1; and
    a side reflecting surface that reflects light emitted from the side surface of said light-emitting element toward an optical axis of said light-emitting device.

18. A light-emitting device comprising:
    a Group III nitride compound semiconductor light-emitting element according to claim 1; and
    a side reflecting surface that reflects light emitted from the side surface of said light-emitting element toward an optical axis of said light-emitting device.

19. A Group III nitride compound semiconductor light-emitting element according to claim 1, wherein said reflecting surface reflects light emitted directly from said light-emitting layer such that at least a portion of said reflected light emerges from a side surface of said light-emitting element to an outside.

20. A Group III nitride compound semiconductor light-emitting element according to claim 1, wherein said reflecting surface reflects light emitted from said light-emitting layer such that at least a portion of said reflected light emerges from said light-emitting element for a first time from a side surface of said light-emitting element.

21. A Group III nitride compound semiconductor light-emitting element according to claim 1, wherein said reflecting surface comprises a film that selectively reflect at least a portion of said light from said light-emitting element.

22. A Group III nitride compound semiconductor light-emitting element according to claim 1, wherein said reflecting surface comprises a film including at least two different materials for selectively reflecting at least a portion of said light from said light-emitting element.

* * * * *